(12) United States Patent
Takahashi

(10) Patent No.: US 6,924,707 B2
(45) Date of Patent: Aug. 2, 2005

(54) RESONATOR

(75) Inventor: Yoshinori Takahashi, Komatsu (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/901,746

(22) Filed: Jul. 10, 2001

(65) Prior Publication Data

US 2002/0011903 A1 Jan. 31, 2002

(30) Foreign Application Priority Data

Jul. 11, 2000 (JP) .................................. 2000-210015

(51) Int. Cl.$^7$ ............................................... H03B 5/18
(52) U.S. Cl. ................ 331/96; 331/107 D; 331/107 SL
(58) Field of Search ..................... 331/107 SL, 107 DP, 331/96, 104 SL, 107 D, 117 D

(56) References Cited

U.S. PATENT DOCUMENTS 5,227,739 A * 7/1993 Mandai et al. ................ 331/96

FOREIGN PATENT DOCUMENTS

| JP | 4-329705 | 11/1992 |
|----|----------|---------|
| JP | 5-335835 | 12/1993 |
| JP | 6-13808  | 1/1994  |
| JP | 6-216614 | 8/1994  |
| JP | 7-066628 | 3/1995  |
| JP | 2001-244741 | 9/2001 |

OTHER PUBLICATIONS

Donald G. Fink, Donald Christiansen; Electronics Engineer's Handbook; McGraw–Hill; 2$^{nd}$ Edition; p. 7–76.*

Howard W. Sams; Radio Shack Dictionary of Electronics; International Standard Book; 5$^{th}$ Edition; p. 452, 709.*

J. Vandesande et al.; "Calculation of the Bandwidth of Microstrip Resonator Antennas"; European Microwave Conference Proceedings; 17–20 Sep. 1979; pp. 116–119;XP002240566; Brighton (GB).

* cited by examiner

Primary Examiner—Timothy P. Callahan
Assistant Examiner—Hiep Nguyen
(74) Attorney, Agent, or Firm—Keating & Bennett, LLP

(57) ABSTRACT

A resonator minimizes degradation of the Q factor, accurately adjusts the frequency, and reduces the size and profile thereof. A voltage controlled oscillator including such a resonator includes a multilayer substrate. The multilayer substrate includes a first grounding conductor layer, a first dielectric layer, a strip line layer, a second dielectric layer, a second grounding conductor layer, and a third dielectric layer. A strip line is disposed on the strip line layer, and a microstrip line is disposed on the third dielectric layer. The strip line is connected to the microstrip line via a through hole to define the resonator. A portion of the second grounding conductor layer that faces the microstrip line is removed.

13 Claims, 5 Drawing Sheets

1

RESONATOR

BACKGROUND OF THE INVENTION

1. Field of the Invention

The present invention relates to a resonator, and more specifically, the present invention relates to a resonator used for a voltage controlled oscillator or other electronic device.

2. Description of the Related Art

FIG. 5 is a schematic representation showing an example of a voltage controlled oscillator including a conventional resonator. A voltage controlled oscillator 1 includes a dielectric substrate 2. A grounding conductor layer 3 is disposed on the lower surface of the dielectric substrate 2. A microstrip line 4 is disposed on the upper surface of the dielectric substrate 2, and a resonator includes the dielectric substrate 2, the grounding conductor layer 3 and the microstrip line 4. In addition, a plurality of electronic component elements 5 are mounted on the surface of the dielectric substrate 2. The voltage controlled oscillator 1 includes these electronic component elements 5 and the resonator. In such a resonator, the frequency can be adjusted by cutting the microstrip line 4.

Further, as shown in FIGS. 6 and 7, the resonator can be defined by the grounding conductor layer 3, the dielectric layer 6 and a strip line 7 by including the multilayer substrate having two grounding conductor layers 3 and a plurality of dielectric layers 6, and laminating the strip line layer 8 defining the strip line 7 between the two grounding conductor layers 3. In this case, a circuit defined by the electronic component elements 5 mounted on the surface of the multilayer substrate is connected to the strip line 7 via a through hole 9.

The size and profile of elements and modules, including, for example, voltage controlled oscillators, used in portable terminals have been reduced, and it has been difficult to reliably provide a sufficient pattern area of the microstrip line pattern provided on the surface of the substrate with the electronic component elements mounted thereon. On the other hand, in the strip line resonator shown in FIG. 6, there are no problems with ensuring the pattern area of the strip line. However, there are structural problems in which the Q factor is low, and the C/N and S/N characteristics are degraded compared with the microstrip line resonator disposed on the substrate surface. Further, the technology to cut the strip line disposed in an intermediate layer of the multilayer substrate is required to adjust the frequency.

Also, if a conductor layer is provided inside the substrate in the microstrip line resonator, the space between the microstrip line and the conductor layer inside the substrate is reduced, and the thickness of the dielectric layer therebetween is also reduced. As a result, the Q factor of the microstrip line resonator is degraded thereby. If the thickness of the inside dielectric layer is increased to prevent such degradation of the Q factor, a problem occurs in that the thickness of the substrate must be increased and cannot satisfy the low profile requirement.

SUMMARY OF THE INVENTION

In order to overcome the problems described above, preferred embodiments of the present invention provide a resonator that minimizes degradation of the Q factor, accurately adjusts the frequency, and has a greatly reduced size and profile thereof.

According to a preferred embodiment of the present invention, a resonator includes a multi-layer substrate having at least two conductor layers which include at least two grounding conductor layers and a plurality of dielectric layers with one of the grounding conductor layers disposed on a lower surface of the multi-layer substrate, a strip line disposed between the two grounding conductor layers, a microstrip line disposed on an upper surface of the multi-layer substrate, and a through hole formed in the dielectric layer to connect the strip line and the microstrip line, wherein at least a portion of the conductor layer that faces the microstrip line and is closest to the microstrip line is removed.

In this resonator, the portion of the conductor layer disposed inside the multilayer substrate facing the microstrip line may be removed so that the grounding conductor layer provided on the lower surface of the multilayer substrate is facing the microstrip line.

The area of the microstrip line on the surface of the multilayer substrate can be reduced by forming the microstrip line on the surface of the multilayer substrate, forming the strip line inside thereof, and connecting these components to each other via the through hole to constitute the resonator. The frequency of the resonator can be adjusted by cutting the microstrip line on the surface of the multilayer substrate. In addition, the space between the microstrip line and the conductor layer can be increased by removing the conductor layer portion inside the multilayer substrate facing the microstrip line. As a result, the degradation of the Q factor caused by a reduction in size is minimized.

The space between the microstrip line and the grounding conductor layer can be maximized by removing a portion of the conductor layer inside the multilayer substrate so that the microstrip line faces the grounding conductor layer on the lower surface of the multilayer substrate, and the Q factor is greatly improved thereby.

The above-described and other features, elements, characteristics and advantages of the present invention will become apparent from the detailed description of preferred embodiments of the present invention with reference to the attached drawings.

DETAILED DESCRIPTION OF PREFERRED EMBODIMENTS

Figure 1:
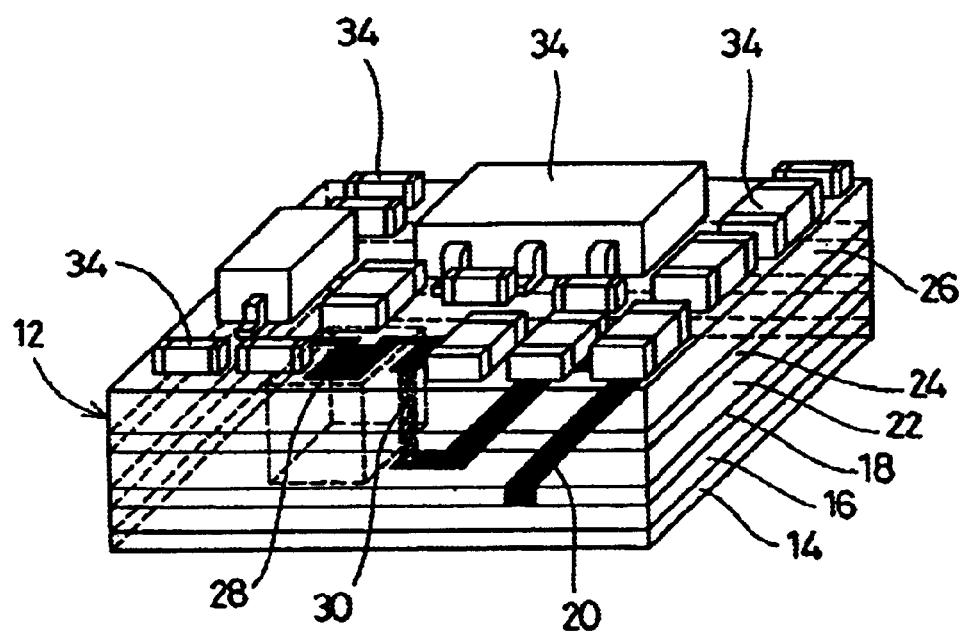
FIG. 1 is a schematic representation of an example of a voltage controlled oscillator including a resonator in accordance with a preferred embodiment of the present invention.
Figure 2:
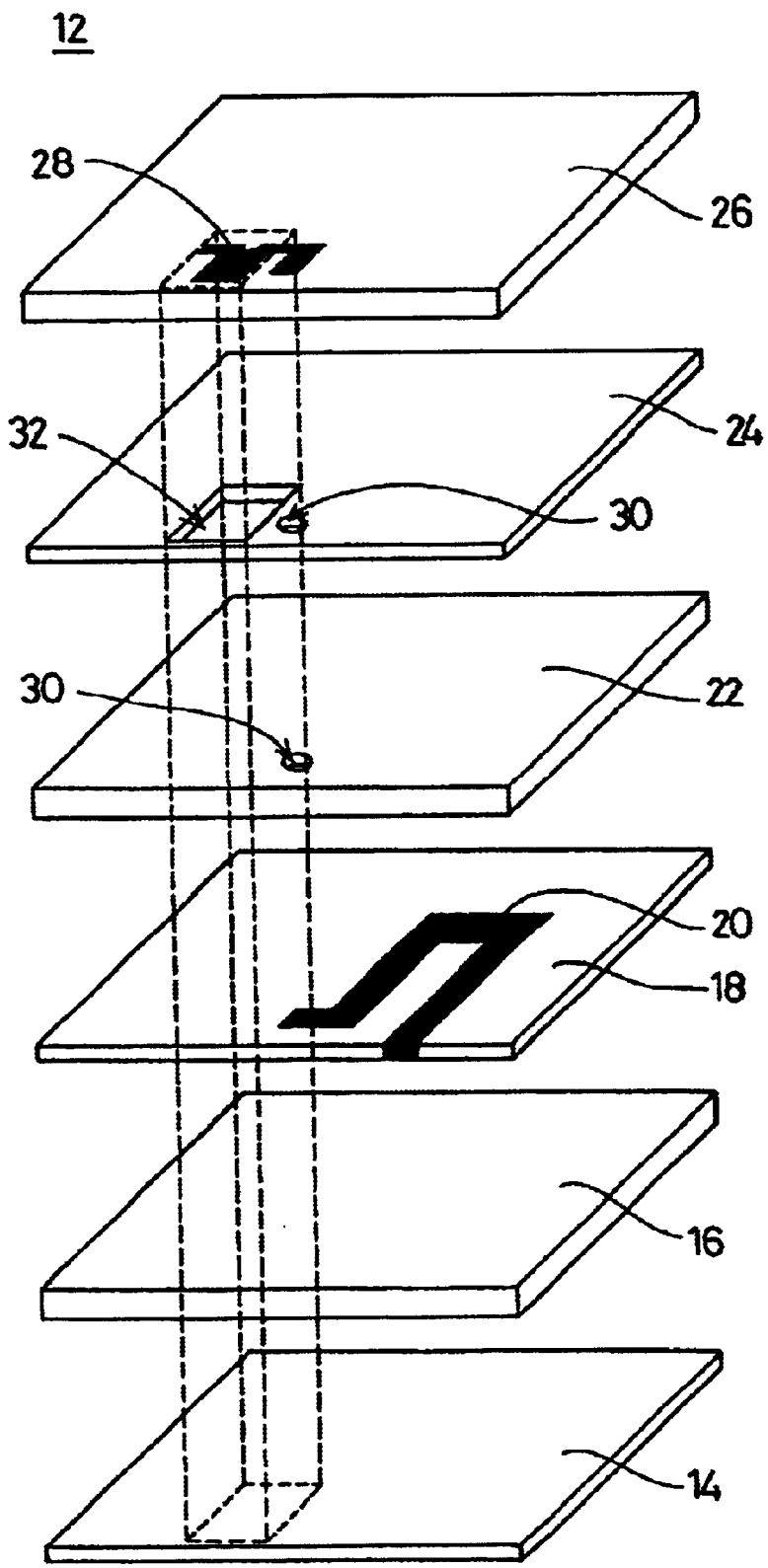
FIG. 2 is an exploded perspective view of a multilayer substrate included in the voltage controlled oscillator shown in FIG. 1.

FIG. 1 is a schematic representation showing an example of a voltage controlled oscillator including a resonator according to a preferred embodiment of the present invention. A voltage controlled oscillator 10 includes a multilayer substrate 12. A first grounding conductor layer 14 is disposed on a lower surface of the multilayer substrate 12 as shown in FIG. 2. A first dielectric layer 16 is laminated on the first grounding conductor layer 14. In addition, a strip line layer 18 is disposed on the first dielectric layer 16. A strip line 20 preferably has, for example, a substantially U-shaped configuration and is disposed on the strip line layer 18. In addition, a second dielectric layer 22 is laminated on the strip line layer 18. A second grounding conductor layer 24 is laminated on the second dielectric layer 22. In addition, a third dielectric layer 26 is laminated on the second grounding conductor layer 24.

Figure 3:
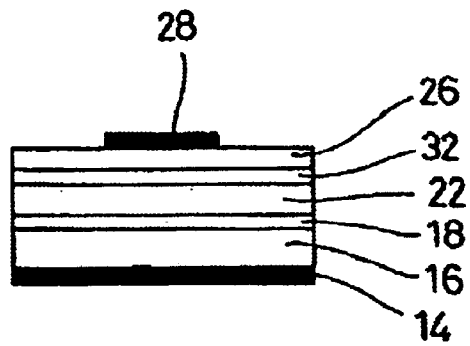
FIG. 3 is a schematic representation showing a removed portion facing a microstrip line of a second grounding conductor layer.
Figure 4:
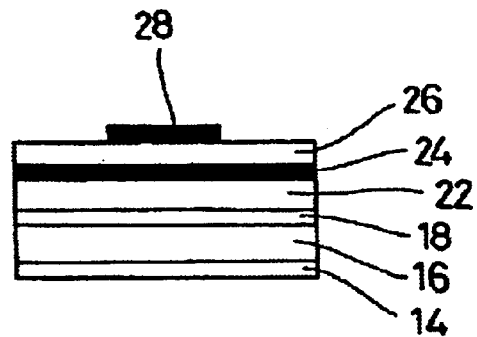
FIG. 4 is a schematic representation showing the microstrip line and the second grounding conductor layer facing each other.
Figure 5:
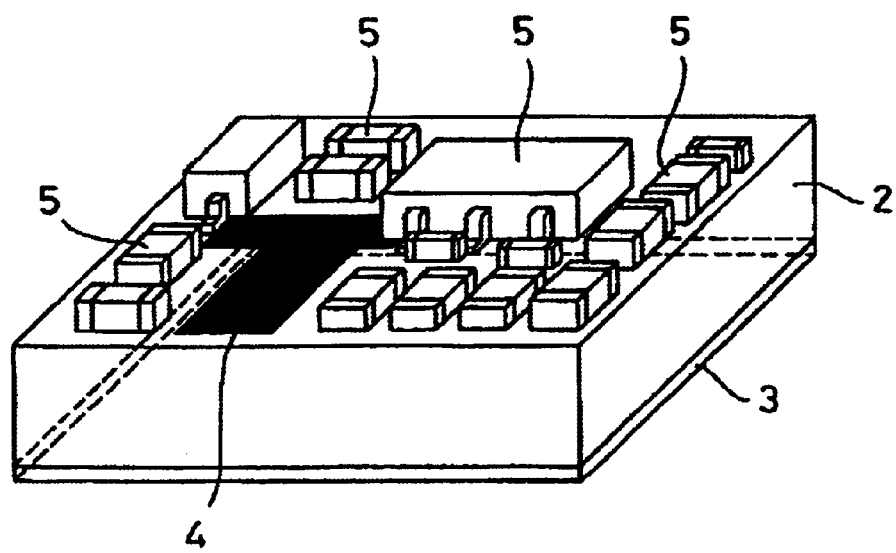
FIG. 5 is a schematic representation of an example of the voltage controlled oscillator including a conventional resonator.
Figure 6:
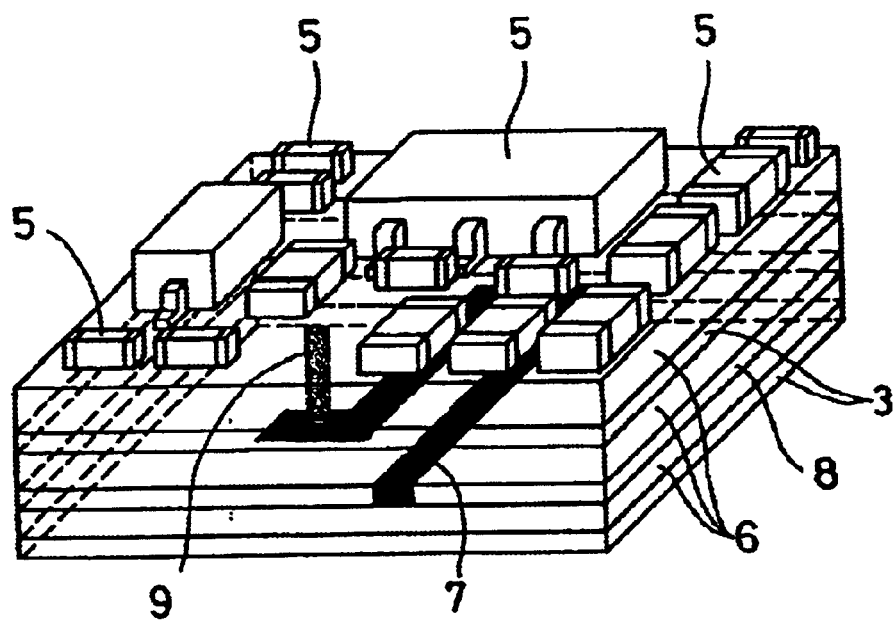
FIG. 6 is a schematic representation of another example of the voltage controlled oscillator including the conventional resonator.
Figure 7:
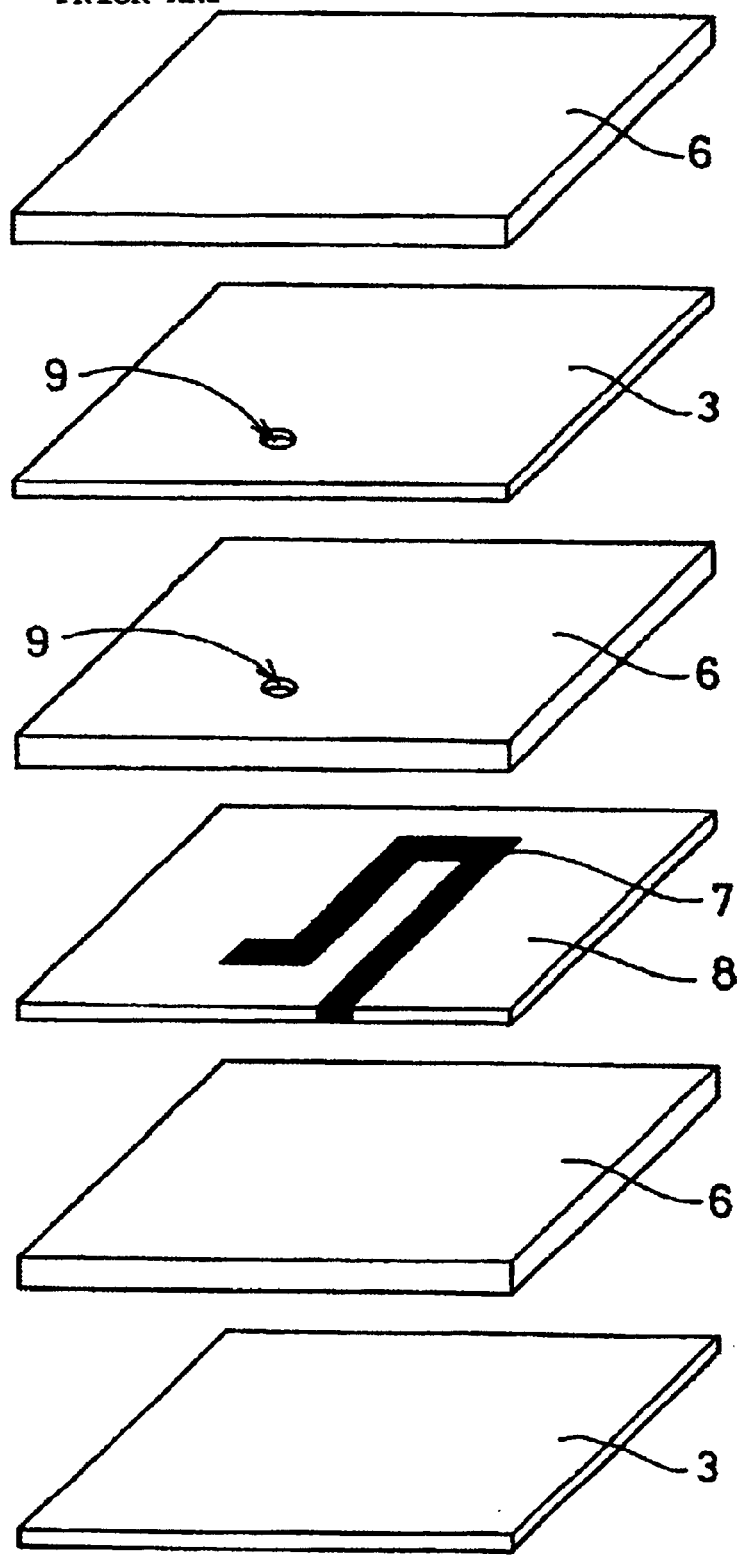
FIG. 7 is an exploded perspective view of a multilayer substrate included in the voltage controlled oscillator shown in FIG. 6.

A microstrip line 28 is disposed on the third dielectric layer 26. One end of the microstrip line 28 is located on a portion corresponding to one end of the strip line 20. To connect the strip line 20 to the microstrip line 28, a through hole 30 is formed in the second dielectric layer 22, the second grounding conductor layer 24, and the third dielectric layer 26. The strip line 20 is connected to the microstrip line 28 via the through hole 30 so as to define a resonator. A portion 32 of the second grounding conductor layer 24 facing the microstrip line 28 is removed, and the microstrip line 28 and the first grounding conductor layer 14 are arranged to face each other via the dielectric layers 16, 22, 26. That is, the portion 32 is an opening formed in the grounding conductor layer 24. The opening 32 preferably has a substantially rectangular or substantially square configuration, but may have any configuration. The opening 32 is arranged such that the microstrip line 28 and the first grounding conductor layer 14 are facing each other as shown in FIG. 3 and the microstrip line 28 and the second grounding conductor layer 24 are facing each other as shown in FIG. 4.

A plurality of electronic component elements 34 are mounted on the upper surface with the microstrip line 28 disposed thereon to define a circuit. This circuit is connected to the resonator to constitute the voltage controlled oscillator 10.

The multilayer substrate 12 is preferably manufactured by printing an electrode paste on a dielectric ceramic green sheet in the shape of each conductor layer, strip line, and microstrip line, and then laminating and baking the electrode paste. In the electrode paste printed portion that forms the second grounding conductor layer 24, the removed or opening 32 facing the microstrip line 28 is provided by not printing the electrode paste thereat.

The first grounding conductor layer 14, the first dielectric layer 16, the strip line 20 provided on the strip line layer 18, the second dielectric layer 22, and the second grounding conductor layer 24 define a strip line resonator, and the first grounding conductor layer 14, the three dielectric layers 16, 22, 26, and the microstrip line 28 define a microstrip line resonator. A single resonator is defined by connecting the strip line resonator to the microstrip line resonator.

In these resonators, one resonator preferably includes one strip line resonator and one microstrip line resonator, and thus, the area of the microstrip line 28 is greatly reduced compared with a case where the resonator includes only microstrip lines. Thus, the multilayer substrate 12 is greatly reduced in size. Further, the frequency of the resonator is easily and accurately adjusted by cutting the microstrip line 28 disposed on the upper surface of the multilayer substrate 12. In addition, the portion 32 facing the microstrip line 28 of the second grounding conductor layer 24 inside the multilayer substrate 12 is removed, and thus, the microstrip line 28 and the first grounding conductor layer 14 are facing each other as shown in FIG. 3, and the dielectric layers 16, 22, 26 therebetween are thick. Thus, in this resonator, the Q factor is greatly improved compared with a case where the microstrip line 28 and the second grounding conductor layer 24 are facing each other as shown in FIG. 4.

An experiment was actually made for the case where a portion facing a microstrip line of an intermediate conductor layer was removed and a case where the portion facing the microstrip line was not removed. Here, the C/N characteristic most related to the Q factor was examined. It was proved that the C/N ratio was improved by about 2 dB in a case where an inside conductor layer was removed, and the space between the microstrip line 28 and the first grounding conductor layer 14 facing each other was about 0.75 mm compared with a case where the second grounding conductor layer 24 shown in FIG. 1 was not removed, and the space between the microstrip line 28 and the second grounding conductor layer 24 facing each other was about 0.15 mm.

The structure of the multilayer substrate 12 is not limited to the structure shown in FIGS. 1 and 2. Other conductor layers may be formed on the multi-layer substrate 12. Also, in such a case, the space between the microstrip line 28 and the conductor layer facing it can be increased by removing a portion facing the microstrip line of the inside conductor layer. The conductor layer facing the microstrip line 28 is not limited to the first grounding conductor layer 14. However, the microstrip line 28 may face a conductor layer inside the multilayer substrate 12, and the space between the microstrip line 28 and the conductor layer facing it may be determined according to a necessary characteristic.

In the present invention, the area that the microstrip line occupies on the surface of the multilayer substrate can be minimized by forming a resonator by connecting the strip line to the microstrip line, and thus the resonator can also be greatly reduced in size. Further, the frequency of the resonator can be easily adjusted by cutting the microstrip line on the surface of the multilayer substrate. In addition, the space between the microstrip line and the conductor layer facing it can be increased by removing the portion of the conductor layer that is disposed inside the multilayer substrate and faces the microstrip line, such that the Q factor is greatly improved.

While the present invention has been particularly shown and described with reference to preferred embodiments thereof, it will be understood by those skilled in the art that the foregoing and other changes in form and details can be made without departing from the spirit and scope of the present invention.

What is claimed is:

1. A resonator comprising:
   a multi-layer substrate having an upper and lower surface and including at least two grounding conductor layers and a plurality of dielectric layers, one of the at least two grounding conductor layers being disposed on the lower surface of the multi-layer substrate;
   a strip line disposed between the at least two grounding conductor layers;
   a microstrip line disposed on the upper surface of said multi-layer substrate; and
   a through hole formed in said dielectric layers to connect said strip line to said microstrip line; wherein
   portions of the one of the at least two grounding conductor layers that is closest to said microstrip line are omitted to define an omitted portion and a through hole in the one of the at least two grounding conductor layers that is closest to said microstrip line;

the through hole in the one of the at least two grounding conductor layers is aligned with the through hole in said dielectric layers and the omitted portion is aligned with the microstrip line; and the through hole in the one of the at least two grounding conductor layers is spaced from the omitted portion such that the through hole in the one of the at least two grounding conductor layers is disposed outside of a periphery of the omitted portion.

2. A resonator according to claim 1, wherein said omitted portion and said through hole in the one of the at least two grounding conductor layers define openings in said one of the at least two grounding conductor layers.

3. A resonator according to claim 2, wherein at least one of the openings has one of a substantially rectangular shape and a substantially square shape.

4. A resonator according to claim 1, wherein said strip line has a substantially U-shaped configuration.

5. A resonator according to claim 1, wherein the resonator comprises only one said strip line.

6. A resonator according to claim 1, wherein the resonator comprises only one said microstrip line.

7. A voltage controlled oscillator comprising:

a resonator including:
- a multi-layer substrate having an upper and lower surface and including at least two grounding conductor layers and a plurality of dielectric layers, one of the at least two grounding conductor layers being disposed on the lower surface of the multi-layer substrate:
- a strip line disposed between the at least two grounding conductor layers;
- a microstrip line disposed on the upper surface of said multi-layer substrate; and
- a microstrip line disposed on the upper surface of said multi-layer substrate; and
- a through hole formed in at least one or said dielectric layers to connect said strip line to said microstrip line; wherein portions of the one of the at least two grounding conductor layers that is closest to said microstrip line are omitted to define an omitted portion and a through hole in the one of the at least two grounding conductor layers that is closest to said microstrip line;

the through hole in the one of the at least two grounding conductor layers is aligned with the through hole in said at least one of said dielectric layers and the omitted portion is aligned with the microstrip line; and the through hole in the one of the at least two grounding conductor layers is spaced from the omitted portion such that the through hole in the one of the at least two grounding conductor layers is disposed outside of a periphery of the omitted portion; and a plurality of electronic component elements disposed on the upper surface of the multi-layer substrate and arranged to define a circuit.

8. The voltage controlled oscillator according to claim 7, wherein the plurality of the electronic component elements and the resonator are electrically connected to each other.

9. The voltage controlled oscillator according to claim 7, wherein said omitted portion and said through hole in the one of the at least two grounding conductor layers define openings in said one of the at least two conductor layers.

10. The voltage controlled oscillator according to claim 9, wherein at least one of the openings has one of a substantially rectangular shape and a substantially square shape.

11. The voltage controlled oscillator according to claim 7, wherein said strip line has a substantially U-shaped configuration.

12. The voltage controlled oscillator according to claim 7, wherein the voltage controlled oscillator comprises only one said strip line.

13. The voltage controlled oscillator according to claim 7, wherein the voltage controlled oscillator comprises only one said microstrip line.

* * * * *